United States Patent
Tihanyi

[19]

[11] Patent Number: 6,166,418
[45] Date of Patent: Dec. 26, 2000

[54] HIGH-VOLTAGE SOI THIN-FILM TRANSISTOR

[75] Inventor: Jenoe Tihanyi, Kirchheim, Germany

[73] Assignee: Infineon Technologies AG, Munich, Germany

[21] Appl. No.: 09/375,065

[22] Filed: Aug. 16, 1999

Related U.S. Application Data

[60] Provisional application No. PCT/DE98/03468, Nov. 25, 1998.

[30] Foreign Application Priority Data

Dec. 16, 1997 [DE] Germany .............................. 197 55 868

[51] Int. Cl.$^7$ ..................................................... H01H 29/76
[52] U.S. Cl. ......................... 257/409; 257/339; 257/488; 257/489; 257/490
[58] Field of Search .................................. 257/409, 339, 257/488, 489, 490, 659

[56] References Cited

U.S. PATENT DOCUMENTS

| | | | |
|---|---|---|---|
| 5,422,505 | 6/1995 | Shirai | 257/327 |
| 5,438,220 | 8/1995 | Nakagawa et al. | 257/487 |
| 5,648,671 | 7/1997 | Merchant | 257/347 |
| 5,969,387 | 10/1999 | Letavic et al. | 257/437 |

FOREIGN PATENT DOCUMENTS

| | | |
|---|---|---|
| 0497427B1 | 8/1992 | European Pat. Off. . |
| 2706623 | 8/1978 | Germany . |
| 2852621 | 6/1980 | Germany . |
| 003046749 | 9/1981 | Germany . |

OTHER PUBLICATIONS

Neilson et al., "Double Field Shield Structure", RCA Tech. Notes, TN No.: 1325, May 1983.
Published International Application No. 97/22149 (Merchant), dated Jun. 19, 1997.
Published International Application No. 96/29744, dated Sep. 26, 1996.
"Integrateded Power Devices", J. Tihanyi, Siemens AG, Components Division, Munich, Germany, 1982, pp. 6–10.

Primary Examiner—Steven H. Loke
Assistant Examiner—Shouxiang Hu
Attorney, Agent, or Firm—Herbert L. Lerner; Laurence A. Greenberg; Werner H. Stemer

[57] ABSTRACT

A high-voltage SOI thin-film transistor includes a semiconductor thin film of a first conductivity type which is embedded in an insulator layer disposed on a semiconductor body. The semiconductor thin film includes a drain zone and a source zone, both having a second conductivity type opposite the first conductivity type. A gate electrode is also provided in the insulator layer. Field plates are disposed obliquely in the insulator layer between the gate electrode and the drain zone, in such a way that their spacing from the semiconductor thin film increases with increasing distance from the gate electrode. Highly doped zones of the second conductivity type in the semiconductor thin film are associated with the field plates, so that when a space charge zone is propagating from the source zone, a voltage at the various field plates stops changing and remains the same.

8 Claims, 1 Drawing Sheet

HIGH-VOLTAGE SOI THIN-FILM TRANSISTOR

CROSS-REFERENCE TO RELATED APPLICATION

This application is a continuation of copending International Application No. PCT/DE98/03468, filed Nov. 25, 1998, which designated the United States.

BACKGROUND OF THE INVENTION

FIELD OF THE INVENTION

The present invention relates to a high-voltage SOI thin-film transistor, including a semiconductor thin film of a first conductivity type which is embedded in an insulator layer disposed on a semiconductor body, a drain zone and a source zone that are both formed in the semiconductor thin film and have a second conductivity type opposite the first conductivity type, and a gate electrode provided in or on the insulator layer.

High-voltage components, which are suitable for high-frequency power grid or mains applications on the order of magnitude of several hundred kilohertz, for instance in lamp ballasts, preferably employ a dielectric insulation technique with thin insulator layers. or instance, an MIS field effect transistor for high source-to-drain voltages over 100 Volts has already been described in German Patent DE 27 06 623 C2, corresponding to U.S. Pat. No. 4,247,860. In that device, a spacing between a gate electrode and a channel zone increases continuously or in stages toward a drain zone. To that end, in that known MIS field effect transistor, the insulator layer provided under the gate electrode is formed of silicon dioxide in such a way that it becomes thicker toward the drain electrode with increasing distance from the source electrode.

An insulator layer field effect transistor with a drift segment between a gate electrode and a drain zone is also known from German Patent DE 28 52 621 C3. In that device, the drift segment includes an increasing number of dopant atoms beginning at the gate electrode and extending toward the drain zone, so that its dopant concentration rises from the gate electrode to the drain zone. That field effect transistor can thus be used at relatively high operating voltages, without requiring auxiliary voltages and auxiliary voltage sources.

Finally, a semiconductor configuration for high-voltage use is also known from European Patent EP 0 497 427 B1, in which the drift segment is formed as a thin silicon layer embedded in a silicon dioxide insulator layer. The silicon layer has a linearly increasing dopant concentration from the gate electrode toward the drain zone.

The dopant concentration of a drift segment formed as a semiconductor thin film can be substantially higher than the dopant concentration of approximately $10^{12}$ cm$^{-2}$ that corresponds to a so-called "breakdown charge". Suitable values for the dopant concentration of the drift segment are accordingly in a range from $5\times10^{12}$ to $2\times10^{13}$ cm$^{-2}$.

SUMMARY OF THE INVENTION

It is accordingly an object of the invention to provide a high-voltage SOI thin-film transistor, which overcomes the hereinafore-mentioned disadvantages of the heretofore-known devices of this general type, which is simple to produce and which is suitable for high-frequency applications into the range of several hundred kilohertz.

With the objects of the invention in view there is also provided a high-voltage SOI thin-film transistor, comprising a semiconductor body; an insulator layer disposed on the semiconductor body; a semiconductor thin film of a first conductivity type embedded in the insulator layer; a drain zone and a source zone both disposed in the semiconductor thin film and having a second conductivity type opposite the first conductivity type; a gate electrode disposed in or on the insulator layer; at least one field plate disposed between the gate electrode and the drain zone, the at least one field plate having an increased distance from the semiconductor thin film at an increased distance from the gate electrode; and at least one highly doped zone of the second conductivity type disposed in the semiconductor thin film and respectively connected to the at least one field plate.

In accordance with another feature of the invention, the semiconductor thin film has a layer thickness of 0.1 to 1.0 $\mu$m and is doped homogeneously with from $10^{12}$ to $5\cdot10^{13}$ atoms/cm$^2$.

In accordance with a further feature of the invention, the spacing between the at least one field plate and the semiconductor thin film can increase either continuously or in stages.

In accordance with an added feature of the invention, the first conductivity type is the n type, so that the drift segment is homogeneously n-doped while the source zone and the drain zone contain p-doping.

In accordance with an additional feature of the invention, there are a plurality of field plates, and the spacing of individual field plates from the semiconductor thin film becomes greater with increasing distance from the gate electrode, so that the ends of the individual field plate that are remote from the gate electrode become farther and farther away from the semiconductor thin film along the path from the gate electrode to the drain zone, as the distance from the gate electrode increases.

In the high-voltage SOI thin-film transistor of the invention, a thin silicon layer, as the semiconductor thin film, is accordingly embedded in the manner of an island in an insulator layer, on a silicon substrate acting as the semiconductor body. The dopant concentration of the drift path in the silicon layer is substantially uniform and has a value of from $10^{12}$ atoms/cm$^2$ to $5\times10^{13}$ atoms/cm$^2$. A suitable thickness for the silicon layer is in the range from 0.1 to 1 $\mu$m.

Field plates are disposed between the gate electrode and the drain zone, spaced apart from and above the silicon layer. These field plates have a steadily increasing spacing from the silicon layer in the direction from the gate electrode to the drain zone. The rise of the field plates can be effected continuously or in stages.

If the source electrode is connected to ground and a positive voltage is applied to the drain electrode in the high-voltage SOI thin-film transistor of the invention, then the voltage of the individual field plates first increases with the voltage applied to the drain electrode. In the process, the space charge zone propagates from the source electrode into the silicon layer which, for instance, is n-conducting and which forms the semiconductor thin film. As soon as this space charge zone reaches the first highly doped zone of the second conductivity type, that is, a p$^+$-doped zone, the voltage at the field plate associated with this highly doped zone stops changing.

If the voltage at the drain electrode is then increased further, the space charge zone propagates in the silicon layer, from the region below the first field plate in the direction toward the drain zone. Given a suitably high voltage, the highly doped zone associated with the second field plate is then reached, and the voltage of the second field plate then also stops changing and remains at this value.

Due to the disposition of the plurality of "obliquely" placed field plates, the high-voltage SOI thin-film transistor is made capable of operating at high operating voltages, without requiring excessively thick oxide films for the insulator layer. On the contrary, insulator layers of silicon dioxide with a thickness of only a few micrometers can be employed.

The insulator layer field effect transistor known from the above-mentioned German Patent DE 28 52 621 C3 can attain a voltage strength of approximately 1000 Volts, if it has a layer thickness of approximately 10 $\mu$m for the gate insulator layer. However, it is only possible to produce such a thickness of the gate insulator layer with great difficulty. Conversely, with the high-voltage SOI thin-film transistor of the invention, voltage strengths on the order of magnitude of 1000 Volts can already be generated with a layer thickness for the insulator layer of only about 3 $\mu$m.

In accordance with a concomitant feature of the invention, the field plates themselves may be composed of n$^+$-doped polycrystalline silicon or metal, such as aluminum, or from parts that are electrically bonded to one another and are formed of different types of materials.

Other features which are considered as characteristic for the invention are set forth in the appended claims.

Although the invention is illustrated and described herein as embodied in a high-voltage SOI thin-film transistor, it is nevertheless not intended to be limited to the details shown, since various modifications and structural changes may be made therein without departing from the spirit of the: invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
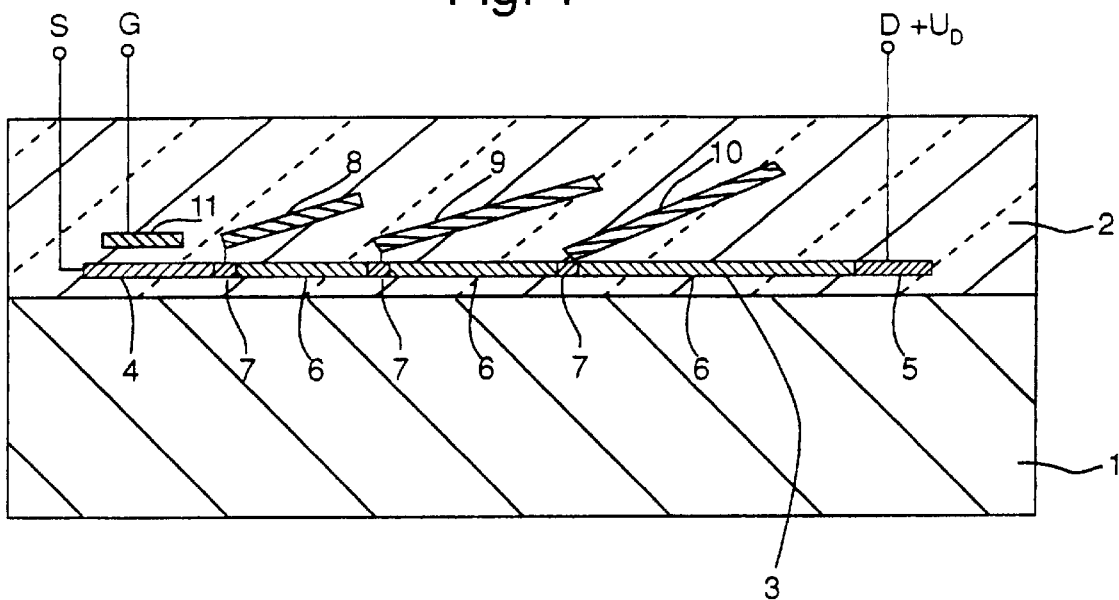
FIG. 1 is a diagrammatic, sectional view through an exemplary embodiment of a high-voltage SOI thin-film transistor of the invention.
Figure 2:
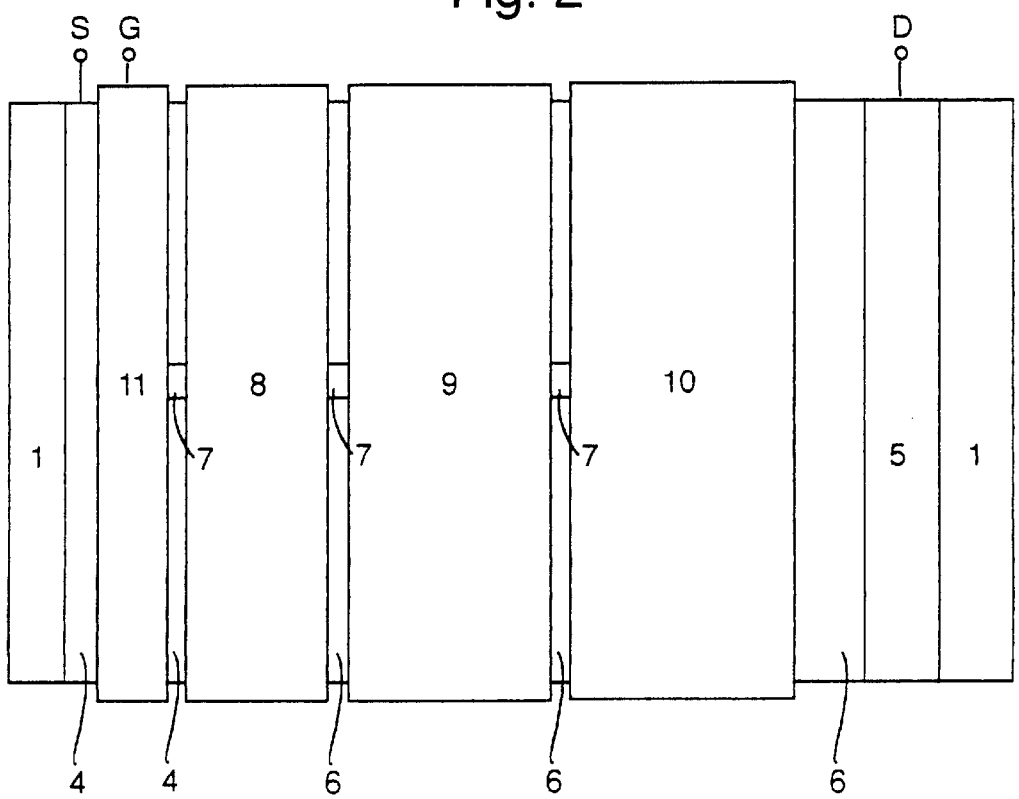
FIG. 2 is a plan view of the high-voltage SOT thin-film transistor of FIG. 1, in which an insulator layer is omitted to more clearly illustrate a disposition of gate electrodes.

Referring now to the figures of the drawings in detail and first, particularly, to FIG. 1 thereof, there is seen a silicon substrate 1. A silicon dioxide layer 2 in which a monocrystalline silicon layer 3 is embedded, is provided on the silicon substrate 1. The silicon layer 3 includes a p-conducting source zone 4, a p-conducting drain zone 5, an n-conducting zone 6, and p$^+$-conducting zones 7. The p$^+$-conducting zones 7 are each connected to a respective field plate 8, 9 and 10, which are placed "obliquely" in such a way that these field plates 8, 9, 10 are disposed at an increasing distance from the silicon layer 3, as their distance from a gate electrode 11 provided above the source zone 4 increases. As the distance from the gate electrode 11 increases, the field plates 8, 9, 10 become wider, or longer in the direction of a source-to-drain path, with an increasing inclination, so that their end disposed opposite the gate electrode 11 becomes farther and farther away from the silicon layer 3. The disposition of the layers may be seen from above in FIG. 2.

The source zone 4 is connected to a source electrode S, which is typically grounded, while the drain zone 5 is connected to a drain electrode D, to which a positive voltage +U$_D$ is applied.

The layer thickness of the silicon layer 3 is between 0.1 and 1 $\mu$m. The dopant concentration of the silicon layer 3 is approximately $10^{12}$ atoms/cm$^2$ to $5\times10^{13}$ atoms/cm$^2$. As has already been mentioned, the field plates 8, 9, 10, which are each connected to the p$^+$-conducting zones 7, have a spacing from the silicon layer 3 that increases either steadily or in stages in the direction of the drain zone 5.

If an increasing voltage is applied to the drain electrode D, then the voltage at the field plates 9, 10 first rises with the drain voltage. As soon as the space charge zone, which propagates from the source zone 4 as the drain voltage increases, reaches the highly doped p$^+$-conducting zone 7 connected to the field plate 9, the voltage of the field plate 9 stops changing, at whatever value it has just then. If the space charge zone, with an even higher voltage at the drain electrode D, then propagates further, the next p$^+$-conducting zone 7 connected to the field plate 10 is reached, and then the voltage at the field plate 10 stops changing as well.

With this multiple field plate configuration, it is possible to apply a high operating voltage to the drain electrode D and nevertheless to keep the layer thickness of the insulator layer 2 in the range of a few micrometers, such as 3 $\mu$m. It has in fact been found that voltages up to approximately 1000 Volts can be applied to the drain electrode D even though the layer thickness of the insulator layer 2 is only about 3 $\mu$m.

The field plates 8, 9, 10 may be formed of polycrystalline n$^+$-conducting silicon, or metal, such as aluminum, or they may be composed of electrically bonded parts made of different types of materials.

I claim:

1. A high-voltage SOI thin-film transistor, comprising:
   a semiconductor body;
   an insulator layer disposed on said semiconductor body;
   a semiconductor thin film of a first conductivity type embedded in said insulator layer;
   a drain zone and a source zone both disposed in said semiconductor thin film and having a second conductivity type opposite the first conductivity type;
   a gate electrode disposed at said insulator layer;
   a plurality of field plates disposed between said gate electrode and said drain zone, each of said field plates of said plurality of field plates forming a slope having an increased distance from said semiconductor thin film at an increased distance from said gate electrode; and each of said field plates in said plurality of field plates having an increased maximum distance from said semiconductor thin film at an increased distance from said gate electrode than a field plate that is closer to said gate electrode; and
   an equal number of highly doped zones as field plates in said plurality of field plates, said highly doped zones being of the second conductivity type and disposed in said semiconductor thin film and respectively connected to said plurality of field plates.

2. The high-voltage SOI thin-film transistor according to claim 1, wherein said gate electrode is disposed in said insulator layer.

3. The high-voltage SOI thin-film transistor according to claim 1, wherein said gate electrode is disposed on said insulator layer.

4. The high-voltage SOI thin-film transistor according to claim 1, wherein said semiconductor thin film has a layer thickness of 0.1 to 1.0 μm and is doped homogeneously with from $10^{12}$ to $5\times10^{13}$ atoms per/cm$^2$.

5. The high-voltage SOI thin-film transistor according to claim 1, wherein said distance between said plurality of field plates and said semiconductor thin film increases in stages.

6. The high-voltage SOI thin-film transistor according to claim 1, wherein said distance between said plurality of field plates and said semiconductor thin film increases continuously.

7. The high-voltage SOI thin-film transistor according to claim 1, wherein the first conductivity type is n type.

8. The high-voltage SOI thin-film transistor according to claim 1, wherein said plurality of field plates is formed of highly doped polycrystalline silicon.

* * * * *